United States Patent [19]

Loper

[11] Patent Number: 5,249,203
[45] Date of Patent: Sep. 28, 1993

[54] PHASE AND GAIN ERROR CONTROL SYSTEM FOR USE IN AN I/Q DIRECT CONVERSION RECEIVER

[75] Inventor: Roger K. Loper, Marion, Iowa

[73] Assignee: Rockwell International Corporation, Seal Beach, Calif.

[21] Appl. No.: 660,492

[22] Filed: Feb. 25, 1991

[51] Int. Cl.$^5$ .............................. H04L 27/06
[52] U.S. Cl. ........................ 375/97; 375/98; 455/324
[58] Field of Search .................. 375/97, 98, 15; 455/245, 324; 358/35; 329/327

[56] References Cited

U.S. PATENT DOCUMENTS

| | | | |
|---|---|---|---|
| 4,631,738 | 12/1986 | Betts et al. | 375/98 |
| 4,943,982 | 7/1990 | O'Neil, II et al. | 375/97 |
| 4,953,182 | 8/1990 | Chung | 375/97 |
| 5,095,536 | 3/1992 | Loper | 455/324 |
| 5,121,072 | 6/1992 | Peterson | 455/214 |

Primary Examiner—Curtis Kuntz
Assistant Examiner—T. Ghebretinsae
Attorney, Agent, or Firm—John J. Horn; Kyle Eppele; H. Fredrick Hamann

[57] ABSTRACT

A system for controlling for gain and phase errors due to mismatches between signal channels in direct conversion receiver having a pair of signal channels carrying I and Q baseband component signals which are in quadrature. In accordance with the system new I' and Q' signals are generated which may be viewed as analogs of the I and Q baseband components but which are related to twice the phase angle defined by the original I and Q baseboard components signal components. Phase angles are determined based on the original I and Q baseband components signals and the new I' and Q' signals. An error signal is then formed from these signals which can be analyzed to determine the gain and phase errors affecting the I and Q baseband components. These components can then be adjusted to correct for gain and phase errors in order to compensate for hardware mismatches between the signal channels in the receiver.

28 Claims, 2 Drawing Sheets

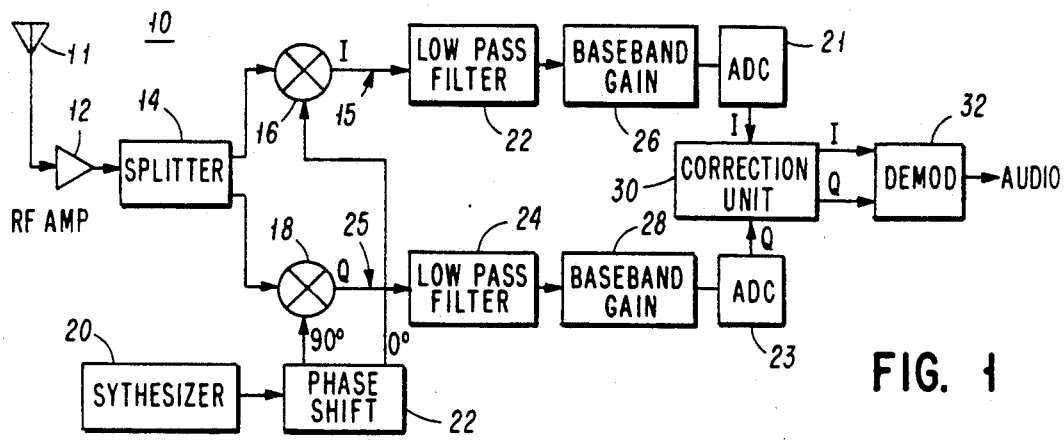
FIG. 1
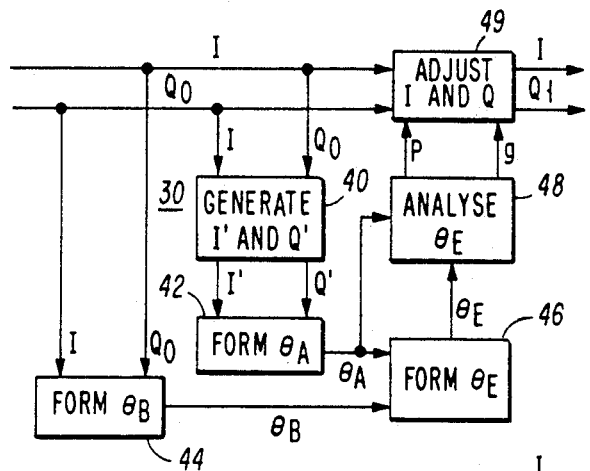
FIG. 2
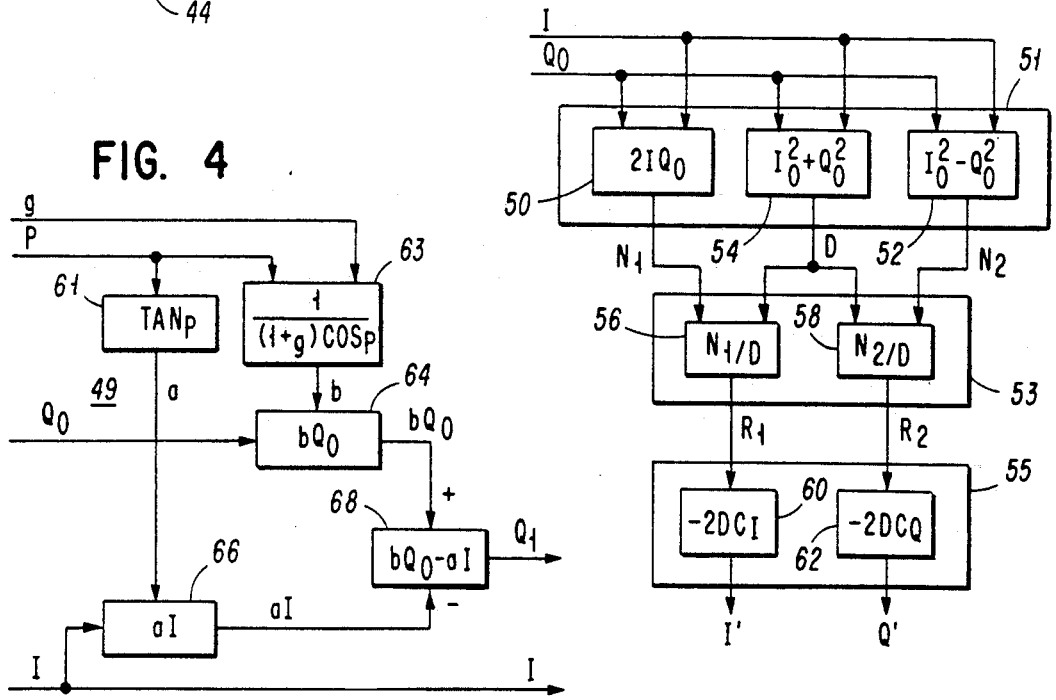
FIG. 3
FIG. 4

PHASE AND GAIN ERROR CONTROL SYSTEM FOR USE IN AN I/Q DIRECT CONVERSION RECEIVER

BACKGROUND OF THE INVENTION

The present invention relates to radio communications technology and more particularly to direct conversion radio receivers.

At the present time the vast majority of radio receivers are of the superheterodyne type employing one or more intermediate frequency stages which allow for filtering and amplification at fixed frequencies. Alternatives have always existed to the superheterodyne architecture such as superregenerative and direct conversion designs. However, these alternative designs have been subject to serious flaws which have relegated radio receivers of these types to specialty roles within the radio communications world.

Despite the widespread adoption of the superheterodyne design, it has been widely recognized that the direct conversion architecture holds great promise for superior Performance. For example, direct conversion receivers are not subject to image rejection problems and are not affected by cross-over spurious responses which are so often the cause of interference and related design difficulties in superheterodyne receivers. Further, direct conversion receivers feature simpler low pass type filters operating at audio frequencies in contrast to the often bulky and expensive bandpass filters employed in superheterodyne receivers, require only a single injection signal at one frequency rather than multiple signals at different frequencies (multiple conversion sets), and provide a good potential for VLSI implementations since a majority of the receiver components consist of active audio and digital circuitry.

In a typical I/Q direct conversion receiver incoming RF communications signals are split into a pair of equal components which are in phase with each other. These RF components are then mixed with separate injection signals on frequency with the communications signal but separated by 90° in phase. I and Q baseband component signals which are in quadrature are thereby formed which may be independently filtered and amplified at audio frequencies on a pair of separate signal channels. The I and Q components formed as a result of the mixing process allow the signal to be conveniently and accurately demodulated upon being supplied to a suitable signal processing unit.

This architecture works well except that variations between the signal channels which commonly occur as a result of changes in temperature, frequency and other operational parameters result in gain and phase mismatches which produce distortion products in the output of the receiver. Gain mismatches of as little as 0.2 dB and phase mismatches of as little as 1° can result in 40 dB distortion products. Phase mismatches are especially difficult to regulate and constitute a major design problem inherent in this architecture. The resulting distortion products can not ordinarily be reduced to less than 30-40 dB in practice and correspond to discrete tones which greatly limit the performance of the receiver.

Researchers investigating the design of direct conversion radio receivers have frequently recognized this limitation and a number of systems for correcting for errors between quadrature signal channels have been proposed. However, these systems have in general been specialized designs limited to the processing of signals of only a single modulation type. For example, U.S. Pat. No. 4,926,433 to Werner Reich entitled "Correction Circuit For A Digital Quadrature-Signal Pair" describes a correction system including an error-detecting stage for deriving amplitude, offset and phase errors from which correction signals are formed. However, error detection is limited to wideband FM signals characterized by quadrature signal pairs capable of forming an "elliptical locus" from which the errors can be determined by comparison with an ideal circle. In contrast, AM signals would result in such a locus taking on irregular shapes from which Proper error signals could not be derived.

The publication by Bolliger and Vollenweider entitled "Some Experiments on Direct Conversion Receivers" in the proceedings of the Fifth International Conference on Radio Receivers and Associated Systems held Jul. 24-26, 1990 at Oxford, England describes a useful method for reducing the gain and phase errors between signal channels in an I/Q direct conversion receiver. In accordance with this method, new signals are formed which are equal to $2IQ$ and $I^2-Q^2$ and these signals are highpass filtered to remove their DC components in order to produce new signals $I_N$ and $Q_N$ which are related to twice the phase angle $\theta$ defined by the original I and Q components and which are characterized by reduced gain and phase errors. The rationale for forming these signals may be readily understood with reference to the basic trigonometric identities $\cos 2\theta = \cos^2 \theta - \sin^2 \theta$ and $\sin 2\theta = 2 \cos \theta \sin \theta$. Since the signals I and Q are in quadrature, they may be seen to correspond to $\cos \theta$ and $\sin \theta$. Consequently, the expressions $2IQ$ and $I^2-Q^2$ are related to $2\theta$ which allows the phase angle to be determined using the $I_N$ and $Q_N$ signals.

In the expressions $2IQ$ and $I^2-Q^2$ phase and gain errors resulting from hardware mismatches between the signal channels are primarily relegated to DC terms which can be filtered out of the signal in order to reduce their effects. The fact that $I_N$ and $Q_N$ relate to $2\theta$ rather than $\theta$ can be compensated for by accordingly adjusting computed phase angles. This method of reducing gain and phase errors between signal channels is highly useful but is limited to angle modulated signals since amplitude modulation would result in the DC terms being converted to low frequency AC components resistant to filtering. Furthermore, this method does not provide for detection of the actual phase and gain errors and full and accurate correction for such errors on an ongoing basis.

It is, therefore, an object of the present invention to provide an I/Q direct conversion receiver which is characterized by superior performance due to the absence of distortion products arising from gain and phase errors between the signal channels.

It is another object of the present invention to provide a system for use in an I/Q direct conversion receiver which is adapted for processing signals of all modulation types and automatically detecting phase and gain errors resulting from mismatches between the signal channels within the receiver and fully correcting for such errors pursuant to a straightforward signal processing algorithm.

It is a yet further object of the present invention to provide a new system for controlling phase and gain errors in an I/Q direct conversion radio receiver which is economic to construct, provides superior performance and may be substantially implemented in VLSI.

SUMMARY OF THE INVENTION

The present invention constitutes a system for controlling phase and gain errors resulting from mismatches between signal channels in a direct conversion receiver having a pair of signal channels carrying I and Q baseband signals which are in quadrature. In accordance with the system of the present invention, I' and Q' signals are formed which may be viewed as "analogs" of the I and Q signals but which are related to twice the phase angle defined by the original I and Q signals. Separate phase angle signals are then formed based on both the I and Q signals and the new I' and Q' signals. These phase angle signals are used to form an error signal which contains information about gain and phase errors. The error signal is then analyzed as a function of phase angle to determine the phase and gain errors. The resulting gain and phase errors are used to adjust the original baseband component signals I and Q and provide corrected baseband component signals which are substantially free from gain and phase errors between the signal channels.

In the preferred embodiment, the invention is implemented in an I/Q direct conversion receiver as a signal processing algorithm resident within a digital signal processing system coupled for receiving digitized I and Q baseband component signals. The I' and Q' signals represent modified forms of sin $2\theta$ and cos $2\theta$ and therefore relate to twice the phase angle defined by the I and Q baseband component signals. However, the I' and Q' signals are processed to remove DC components which reflect gain and phase errors. It has been discovered that the error signal which results from differencing phase angles based on the I and Q signals and the I' and Q' signals may be used to detect phase and gain errors as a function of the original phase angle defined by the I and Q signals. The resulting phase and gain errors may then be employed in adjusting the Q baseband component in order to correct the relationship between the original I and Q components and provide I and Q baseband component signals substantially free from gain and phase errors due to hardware mismatches between the signal channels.

BRIEF DESCRIPTION OF THE DRAWINGS

FIG. 1 shows an overall block diagram of a direct conversion receiver in which a correction unit in accordance with the present invention is employed for controlling gain and phase errors;

FIG. 2 shows a block diagram of the correction unit shown in FIG. 1 which is operative for detecting phase and gain errors and adjusting the I and Q baseband component signals to correct for such errors;

FIG. 3 shows a block diagram of the module shown in FIG. 2 which is operative for generating the I' and Q' signals which may be viewed as "analogs" of the I and Q baseband component signals;

FIG. 4 shows a block diagram of the module of FIG. 2 which is operative for actually adjusting the original Q baseband component signal to correct for gain and phase errors.

DESCRIPTION OF THE PREFERRED EMBODIMENT

Figure 5:
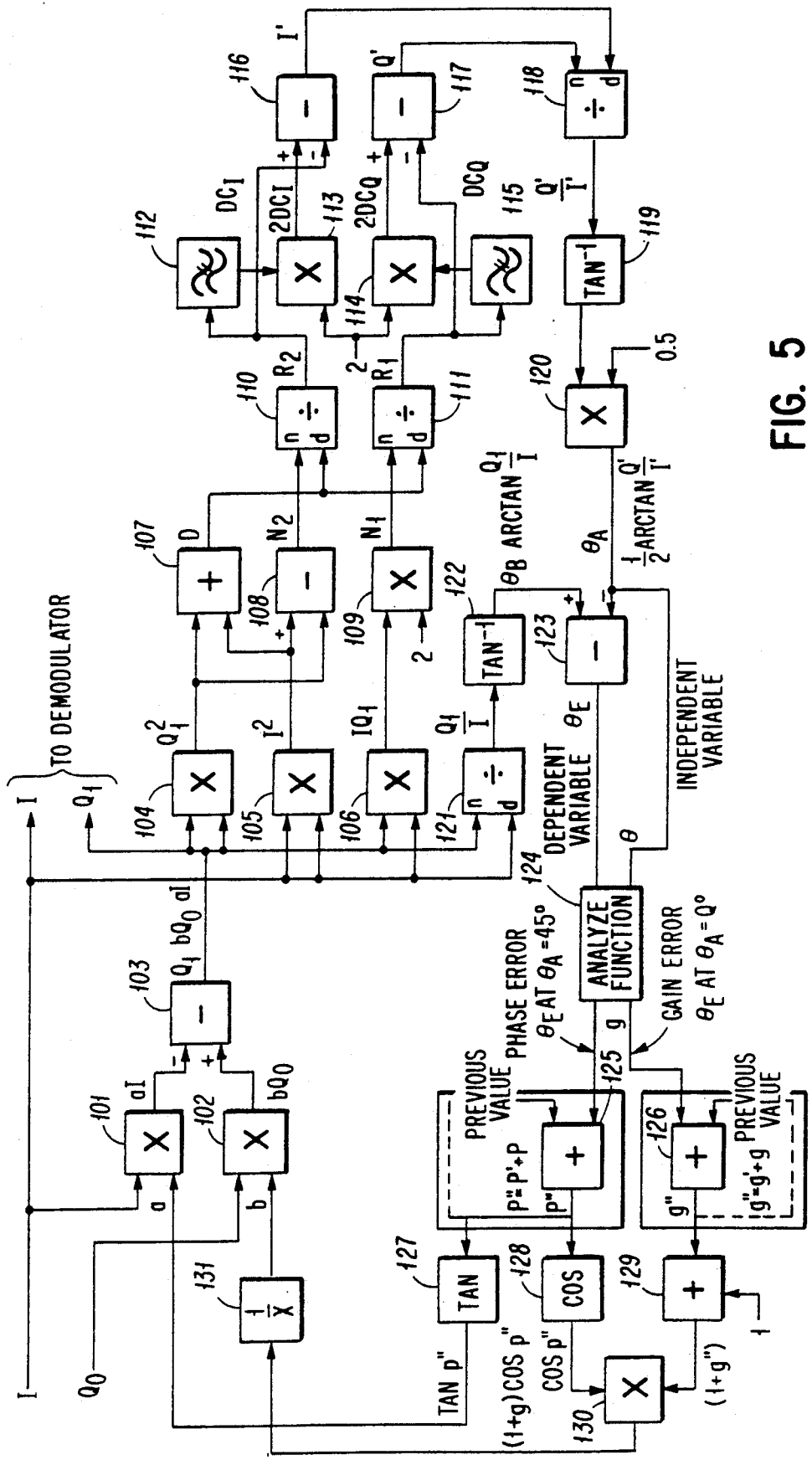
FIG. 5 shows a flow chart of a digital signal processing algorithm in accordance with the present invention for detecting gain and phase errors and adjusting baseband component signals to correct for such errors on an iterative basis.

Referring now to FIG. 1, a direct conversion radio receiver 10 is shown having two baseband channels 15 and 25 for processing baseband signal components I and Q which are in quadrature (i.e., 90° out of phase). The receiver 10 includes a correction unit 30 for controlling phase and gain errors resulting from hardware mismatches between the signal channels. Reviewing the structure and operation of the radio receiver 10, radio frequency ("RF") signals picked up by the antenna 11 are supplied to the preamplifier 12 which provides a limited amount of RF gain. The output of the preamplifier 12 is passed to the splitter 14 which divides the signal into equal amplitude and inphase RF components which are then provided to the mixers 16 and 18. The synthesizer 20 generates an injection signal on frequency with the communications signal intended to be received and processed by the radio receiver 10. The injection signal from the synthesizer 20 is passed to a phase shifting network 22 which splits the signal into equal amplitude but in quadrature components which are then supplied to the mixers 16 and 18.

The mixers 16 and 18 generate the I and Q baseband components as a product of the interaction of the signals from the phase shifter 22 and the RF signal components from the splitter 14. The baseband signal channels 15 and 25 include separate lowpass filter networks 22 and 24 which provide selectivity for the receiver 10 and separate baseband amplifier networks 26 and 28 which are the primary source of gain for the receiver 10. After being filtered in the filter networks 22 and 24 and amplified by the amplifier networks 26 and 28, the baseband signal components I and Q are supplied to the analog-to-digital convertors 21 and 23. The analog-to-digital convertors 21 and 23 convert the I and Q baseband components from analog to digital formats.

The resulting digitized I and Q baseband component signals are supplied to the correction unit 30. The correction unit 30 processes the digital I and Q signals in order to detect any Phase and gain errors between the signal channels and accordingly adjust the relationship between the I and Q baseband components to correct for such errors. The resulting corrected I and Q baseband signals are supplied to demodulator 32 which extracts the information carried by the signals and provides a corresponding audio output.

Referring now to FIG. 2, the correction unit 30 of the present invention is shown in greater detail as receiving the baseband component signals I and $Q_0$ as input and supplying the baseband component signals I and $Q_1$ as output with the Q signal component being subscripted in order to better illustrate the action of the unit 30 in adjusting the I and Q components. The correction unit 30 includes modules 40, 42, 44, 46 and 48 which detect phase and gain errors between the signal channels 15 and 25 based on the I and $Q_0$ signals and a module 50 which adjusts the relationship between the I and $Q_0$ signals by modifying signal $Q_0$ in order to produce corrected I and $Q_1$ baseband component signals characterized by substantially reduced phase and gain errors. It should be understood that the correction unit 30 preferably constitutes a microprocessor system adapted for performing digital signal processing functions and that the modules 40, 42, 44, 46, 48 and 49 would accordingly comprise software routines which provide signal processing functions.

The module 40 receives the input signal components I and $Q_0$ and generates new signal components I' and Q' based on the I and $Q_0$ components. The signals I' and Q' may be roughly viewed as "analogs" to the input signals I and $Q_0$ although they do not carry corresponding amplitude information and are related to twice the phase angle defined by the I and $Q_0$ signals. Further, the I' and Q' signals are characterized by reduced gain and phase errors. The module 42 uses the I' and Q' signals to determine a phase angle signal $\theta_A$. Likewise, the component 44 uses the I and $Q_0$ signals to determine a phase angle signal $\theta_B$. The component 46 then differences the phase angles $\theta_A$ and $\theta_B$ to generate a phase angle error signal $\theta_E$. The resulting error signal $\theta_E$ has been discovered to contain useful information corresponding to the gain and phase errors between the signal channels 15 and 25. Accordingly, the error signal $\theta_E$ is analyzed pursuant to the operation of the component 48 as a function of the phase angle $\theta_A$ (although the phase angle signal $\theta_B$ could also be used) in order to generate phase and gain error signals p and g. The phase and gain errors p and g are supplied to the module 49 and are used in adjusting the relationship between the I and $Q_0$ baseband signal components to produce new baseband signal components I and $Q_1$ which are corrected with respect to gain and phase errors.

Referring now to FIG. 3, the module 40 maybe viewed as having three stages 51, 53 and 55 of operation whereby the signals I' and Q' are generated based on the signals I and $Q_0$. In the first stage 51 the submodules 50, 52 and 54 operate on the baseband component signals I and $Q_0$ to produce the signals $N_1$, $N_2$ and D which correspond to the expressions $2IQ_0$, $I^2 - Q_0^2$ and $I^2 + Q_0^2$, respectively. It should be noted that the signals $N_1$ and $N_2$ correspond to the trigometric expressions $\cos 2\theta_A$ and $\sin 2\theta_A$ and therefore are related to phase angle as are the I and $Q_0$ signals. In the second stage 53 the signals $N_1$ and $N_2$ are normalized by being divided by the common factor signal D. The submodules 56 and 58 therefore produce the signals $R_1$ and $R_2$ which represent the expressions $N_1/D$ and $N_2/D$ and which correspond to a signal of substantially constant amplitude. In the third stage 55 the signals $R_1$ and $R_2$ are differenced with signals $DC_I$ and $DC_Q$ which are equal to twice their own DC components. Since gain and phase errors are primarily contained in the DC components of the signals $R_1$ and $R_2$ these errors are reduced by removing these components. The submodules 60 and 62 subtract twice the DC components $2DC_I$ and $2DC_Q$ from the signals $R_1$ and $R_2$ in order to produce the signals I' and Q'. It should be noted it is necessary to subtract out twice the DC components $DC_I$ and $DC_Q$ due to the effects of normalization performed in stage 53.

The signals I' and Q' may be thought of as "analogs" of the signals I and $Q_0$ which are characterized by reduced phase and gain errors. However, the signals I' and Q' are in many ways dissimilar to I and $Q_0$ especially in that they are of substantially constant amplitude and are related to $2\theta_A$ instead of $\theta_A$.

Referring now to FIG. 4, the module 49 is operative for adjusting the baseband component signal $Q_0$ so that it is 90° out of phase and equal in average magnitude to the baseband signal I based on the phase and gain error signals g and p. Submodule 61 forms a signal a corresponding to the expression tan p. Submodule 63 forms a signal b corresponding to the expression $1/(1+g) \cos p$. The signals a and b are combined with the baseband signal components I and $Q_0$ in submodules 64 and 66 whereby the signals aI and $bQ_0$ are formed by multiplying the signals a and b by the signals I and $Q_0$. In submodule 68 the signals aI and $bQ_0$ are differenced in order to form the signal $Q_1$. In effect, a small amount of the inphase baseband component I is combined with the quadrature baseband component to correct for phase errors while the quadrature baseband component itself is corrected for gain errors. The output signal $Q_1$ is adjusted to be 90° out of phase with the inphase baseband component I and to have equal amplitude with the baseband component I.

Referring now to FIG. 5, a flow chart is shown for a correction unit 30 which controls gain and phase errors between the signal channels 15 and 25 by iteratively calculating the gain and phase errors so that progressively improving adjustments can be made to the baseband signals I and $Q_0$ in producing the corrected baseband signal components I and $Q_1$. Adjustments are made to the quadrature baseband component $Q_0$ in Steps 101, 102 and 103 whereby a corrected quadrature baseband component signal $Q_1$ is generated for supply to the demodulator 32 and for use in Steps 104, 105, 106 and 121 which represent beginning steps in calculating (and recalculating) the phase and gain errors p and g. In accordance with Step 104 the 24 signal $Q_1$ is squared and this output is supplied to Steps 107 and 108. In accordance with Step 105 the signal I is squared and this output is also supplied to Steps 107 and 108. In Step 106 the signals I and $Q_1$ are multiplied together and this product output is supplied to Step 109. In Step 107 the signals representing $Q_1^2$ and $I^2$ are added to form the signal D which is supplied to Steps 110 and 111. In Step 108 the signals representing $Q_1^2$ and $I^2$ are differenced to form the signal $N_2$ which is supplied to Step 110. In the Step 109 the signal representing $IQ_1$ is doubled to form the signal $N_1$ which is supplied to Step 111.

In Steps 110 and 111 the signals $N_1$ and $N_2$ (which relate to the phase angle $2\theta_A$) are normalized by being divided by the signal D in order to generate the signals R1 and R2 which are amplitude "stabilized". Pursuant to Steps 115 and 112 the signals R1 and R2 are low pass filtered in order to isolate their DC components $DC_Q$ and $DC_I$. These DC components are then multiplied by a factor of two in Steps 113 and 114 in order to generate signals representing $2DC_I$ and $2DC_Q$. In accordance with Steps 116 and 117, the DC component outputs of Steps 113 and 114 are differenced with the signals $R_2$ and $R_1$ formed in Steps 110 and 111 in order to produce the signals I' and Q'.

A signal representing the ratio Q'/I' is formed in Step 118 and a signal representing the arctangent of this ratio is generated in Step 119. Since the signals I' and Q' are related to $2\theta_A$, the output of Step 119 is multiplied by ½ in Step 120 in order to form the signal $\theta_A$ representing phase angle. Similarly, a signal representing the ratio $Q_1/I$ is formed in Step 121 and a signal representing the arctangent of this ratio is generated in Step 122 in order to form the signal $\theta_B$. It should be remembered that the signals representing $\theta_A$ and $\theta_B$ generated in Steps 120 and 122 are measures of the same basic quantity, namely, the phase angle defined by the quadrature signals I and $Q_0$. Nevertheless, important differences exist between these signals based on the derivation of the signals I' and Q' in Steps 104-117.

Consequently, the signals representing $\theta_A$ and $\theta_B$ used in Steps 120 and 122 may be differenced as shown in Step 123 to produce a phase angle error signal $\theta_E$ which has been discovered to have unique qualities by which phase and gain errors between the signal channels in an I/Q a direct conversion receiver may be determined. In accordance with Step 124, the signal $\theta_E$ is analyzed as a function of the signal $\theta_A$ produced in Step 120. The signal $\theta_E$ may be evaluated at $\theta_A$ equal to 0° in order to determine gain error g and at $\theta_A$ equal to 45° in order to determine phase error p. It should be noted that the signal $\theta_E$ could alternatively be evaluated equally well at $\theta_A$ equal to 180° and 225° in order to determine the gain and phase errors p and g. If samples at 0° or 45° are not available, values may be determined for these points by interpolation. It is believed gain errors using $\theta_E$ as a function of $\theta_A$ is attributable to the ability to evaluate phase and quadrature characteristics of the signals I and $Q_0$ which result in $\theta_E$ solely representing either gain or phase errors at different points during the phase angle cycle defined by the signals I and $Q_0$.

It should be noted that a more general solution exists for determining gain and phase errors based on $\theta_E$. Given two samples and assuming $\theta_{E1}$ and $\theta_{A1}$ refer to values corresponding to first sample and $\theta_{E2}$ and $\theta_{A2}$ refer to values corresponding to the second sample than $\theta_{E1}$ and $\theta_{E2}$ can be expressed in terms gain error 9 and phase error p as follows:

$$\theta_{E1} = a_1 g + b_1 p$$

$$\theta_{E2} = a_2 g + b_2 p$$

where $$a_1 = 0.5 sin(2\theta_{A1})$$

$$b_1 = 0.5 cos(2\theta_{A1})$$

$$a_2 = 0.5 sin(2\theta_{A2})$$

$$b_2 = 0.5 cos(2\theta_{A2})$$

The above equations may then be solved for g and p resulting in the equations:

$$g = \frac{b_1 \theta_{E2} - b_2 \theta_{E1}}{a_2 b_1 - a_1 b_2}$$

$$p = \frac{a_2 \theta_{E1} - a_1 \theta_{E2}}{a_2 b_1 - a_1 b_2}$$

which allow gain error and phase error to be determined with accuracy from any two samples of $\theta_E$.

Pursuant to Steps 125 and 126 the signals representing phase and gain errors p and g are added to previous values of the gain and phase errors p' and g' computed in the previous iteration of the steps 101-131 whereby progressively more accurate representations of the gain and phase errors p'' and g'' are generated for use in correcting the baseband signal components I and $Q_0$. In Step 127, a signal a representing tan p'' is generated and supplied as an input to Step 101. In Steps 128, 129 and 130 signals representing cos p'' and (1+g'') are generated and multiplied together to produce a signal representing (1+g'') cos p''. The reciprocal of this signal is generated in Step 131 in order to form the signal b which is supplied as an input to Step 102.

The signals a and b are multiplied by the baseband component signals I and $Q_0$ in steps 101 and 102 with the signals a and b acting as coefficients whereby I and $Q_0$ are combined in different proportions in Step 103 as signals representing $bQ_0$ and aI are differenced in order to produce the corrected baseband component signal $Q_1$ which is adjusted in accordance with the phase and gain error signals p'' and g''. The signals I and $Q_1$ which are corrected for gain and phase errors between the signal channels are supplied to the demodulator 32 and provided as inputs to Steps 104, 105, 106 and 121 for use in subsequent iterations of the signal processing algorithm.

While particular embodiments of the present invention have been shown and described, it should be clear that changes and modifications may be made to such embodiments without departing from the true scope and spirit of the invention. It is intended that the appended claims cover all such changes and modifications.

I claim:

1. A method of controlling gain and phase errors between signal channels in a direct conversion receiver having a pair of signal channels carrying I and Q signals which are in quadrature and are characterized by a phase angle $\theta_A$, comprising the steps of:
   (1) generating signals I' and Q' based on said I and Q signals by:
      (a) forming signals representing $sin(2\theta_A)$ and $cos(-2\theta_A)$, and
      (b) reducing phase and gain errors included in said signals representing $sin(2\theta_A)$ and $cos(2\theta_A)$ by removing DC components included in these signals in order to produce said I' and Q' signals;
   (2) generating a phase angle error signal $\theta_E$ based on said I, Q, I' and Q' signals by:
      (a) forming a first phase angle signal $\theta_A$ based on said I' and Q' signals.
      (b) forming a second phase angle signal $\theta_B$ based on said I and Q signals, and
      (c) forming an error signal $\theta_E$ based on said first and second signals $\theta_A$ and $\theta_B$;
   (3) analyzing said error signal $\theta_E$ as a function of said phase angle $\theta_A$ to determine gain and phase errors g and p; and
   (4) adjusting the relationship between said I and Q signals to correct for said gain and phase errors g and p.

2. The process of claim 1, wherein:
forming signals representing $sin(2\theta_A)$ and $cos(2\theta_A)$ is performed in accordance with the equations $sin(2\theta_A) = 2IQ$ and $cos(2\theta_A) = I^2 - Q^2$,
reducing gain and phase errors is performed by differencing said signals representing $sin(2\theta_A)$ and $cos(2\theta_A)$ with their DC components $DC_I$ and $DC_Q$; and
forming an error signal $\theta_E$ is performed by differencing said first and second signals $\theta_A$ and $\theta_B$.

3. The process of claim 2, wherein:
generating error reduced signals I' and Q' further includes:
normalizing the amplitudes of said signals representing $sin(2\theta_A)$ and $cos(2\theta_A)$ using a signal representing the expression $I^2 + Q^2$ as a divisor, and
reducing gain and phase errors is performed by differencing said signals representing $sin(2\theta_A)$ and $cos(2\theta_A)$ with twice their DC components $2DC_I$ and $2DC_Q$.

4. The process of claim 1, wherein:
forming the signal $\theta_A$ is performed in accordance with the equation:

$$\theta_A = \arctan \frac{Q'}{I'} \text{ and}$$

forming the signal $\theta_B$ is performed in accordance with the equation:

$$\theta_B = \arctan \frac{Q}{I}$$

5. The process of claim 1, wherein:
analyzing said error signal $\theta_E$ as a function of phase angle is performed by evaluating $\theta_E$ at $\theta_A=0°$ in order to ascertain gain error and at $\theta_A=45°$ in order to ascertain phase error.

6. The process of claim 1, wherein:
adjusting said I and Q signals is performed in accordance with the equation:

$$Q_1 = bQ_\phi - aI$$

where:
  $Q_1$ = Q signal as adjusted for errors
  $Q_\phi$ = unadjusted Q signal
  a = tan p
  b = 1/(1+g)cos p
  p = phase error
  g = gain error.

7. The process of claim 1, wherein said steps are iteratively performed with the Q input signal corresponding to values corrected in accordance with gain and phase errors ascertained in previous iterations.

8. A process for controlling gain and phase errors between signal channels in a direct conversion receiver having a pair of signal channels carrying I and Q baseband component signals which are in quadrature, comprising the steps of:
  (1) generating an error signal $\theta_E$ by differencing a first phase angle signal $\theta_B$ based on said I and Q signals with a second phase angle signal $\theta_A$ based on I' and Q' signals approximately representing 2IQ and $I^2-Q^2$ as adjusted to substantially remove their DC components in order to reduce gain and phase errors;
  (2) analyzing said error signal $\theta_E$ as a function of phase angle in order to determine the phase error p and gain error g between the signal channels in the receiver; and
  (3) adjusting said I and Q signals in order to correct for gain and phase errors between said signal channels in accordance with said gain and phase error signals g and p.

9. The process of claim 8, wherein:
said I' and Q' signals are normalized in accordance with a common factor in order to provide amplitude stabilization.

10. The process of claim 8, wherein:
said phase angle signals $\theta_A$ and $\theta_B$ are formed in accordance with the expressions arctan Q'/I' and arctan Q/I, respectively.

11. The process of claim 9, wherein:
said I' signal corresponds approximately to the expression $2IQ/(I^2+Q^2)-2DC_I$, and
said Q' signal corresponds approximately to the expression $I^2-Q^2/(I^2+Q^2)-2DC_Q$
where:
  $DC_I$ = the DC component of $2IQ/(I^2+Q^2)$
  $DC_Q$ = the DC component of $I^2-Q^2/(I^2+Q^2)$.

12. The process of claim 8, wherein:
said step of analyzing said error signal $\theta_E$ includes the substeps of:
  (a) determining gain error g by evaluating $\theta_E$ at $\theta_A=0°$, and
  (b) determining phase error p by evaluating $\theta_E$ at $\theta_A=45°$.

13. The process of claim 8, wherein: said step of adjusting said I and Q signals is performed in accordance with the equation:

$$Q_1 = bQ_\phi - aI$$

where:
  $Q_1$ = Q signal as adjusted for errors
  $Q_\phi$ = unadjusted Q signal
  a = tan p
  b = 1/(1+g)cosp
  p = phase error
  g = gain error 14. An apparatus for controlling errors between signal channels in a direct conversion receiver having a pair of signal channels carrying I and Q baseband signals which are in quadrature, said apparatus comprising:
  (1) means for generating I' and Q' signals which correspond to analogs of said I and Q signals but are characterized by reduced gain and phase errors;
  (2) means for forming a first phase angle signal $\theta_A$ based on said I' and Q' signals;
  (3) means for forming a second phase angle signal $\theta_B$ based on said I and Q signals;
  (4) means for forming a phase angle error signal $\theta_E$ based on said first and second phase angle signals $\theta_A$ and $\theta_B$;
  (5) means for analyzing said phase angle error signal $\theta_E$ to determine phase error p; and
  (6) means for adjusting the relationship between said I and Q signals to correct for said phase error p.

15. The apparatus of claim 14, wherein:
said means for analyzing said phase angle error signal $\theta_E$ is also operative for determining gain error g, and said means for adjusting the relationship between said I and Q signals is also operative for correcting for said gain error g.

16. The apparatus of claim 14, wherein:
said means for generating I' and Q' signals includes:
  (a) means for forming signals approximately representing 2IQ and $I^2-Q^2$,
  (b) means for differencing said signals representing 2IQ and $I^2-Q^2$ with their DC components $DC_I$ and $DC_Q$.

17. The apparatus of claim 16, wherein: said means for generating I' and Q' signals further includes:
means for normalizing said signals representing 2IQ and $I^2-Q^2$ using a common divisor signal representing $I^2+Q^2$; and wherein:
said means for differencing said signals representing 2IQ and $I^2-Q^2$ with their DC components differences these signals with twice their DC components $2DC_I$ and $2DC_Q$.

18. The apparatus of claim 14, wherein:
said means for forming a first and second phase angle signals $\theta_A$ and $\theta_B$ operate in accordance with the equations $\theta_A$=arctan Q'/I' and $\theta_B$=arctan Q/I, respectively.

19. The apparatus of claim 14, wherein:
said means for generating I' and Q' signals is operative in accordance with the equations:

$$I' = 2IQ/(I^2+Q^2) - 2DC_I \text{ and}$$
$$Q' = I^2 - Q2/(I^2+Q^2) - 2DC_Q$$

where:
$DC_I$ = DC component of $2IQ/(I^2+Q^2)$ and
$DC_Q$ = DC component of $I^2-Q2/(I^2+Q^2)$.

20. The apparatus of claim 14 wherein: said means for analyzing said phase error signal $\theta_E$ operates to determine phase error by evaluating $\theta_E$ at $\theta_A = 45$.

21. The apparatus of claim 15, wherein:
gain error g is determined by evaluating $\theta_E$ at $\theta_A = 0°$, and
phase error p is determined by evaluating $\theta_E$ at $\theta_A = 45°$.

22. The apparatus of claim 15, wherein:
said means for adjusting the relationship between said I and Q signals is operative in accordance with the equation:

$$Q_1 = bQ_\phi - aI$$

where:
$Q_1$ = Q signal as adjusted for errors
$Q_\phi$ = unadjusted Q signal
a = tan p
b = 1/(1+g)cosp
p = phase error
g = gain error 23. The apparatus of claim 15, wherein:
said means for generating I' and Q' signals is operative in accordance with the equations:

$$I' = 2IQ/(I^2-Q^2) - 2DC_I \text{ and}$$
$$Q' = I^2 - Q^2/(I^2+Q^2) - 2DC_Q$$

where:
$DC_I$ = DC component of $2IQ/(I^2+Q^2)$ and
$DC_Q$ = DC component of $I^2-Q^2/(I^2+Q^2)$ 24. A process for correcting errors between signal channels in a direct conversion receiver having a pair of signal channels carrying I and Q baseband signals which are in quadrature, said process comprising the steps of:
(1) generating I' and Q' signals which may be viewed as analogs of said I and Q signals but which are characterized by reduced gain and phase errors;
(2) forming a phase angle error signal $\theta_E$ from said I and Q baseband signals and said I' and Q' signals;
(3) analyzing said phase angle error signal $\theta_E$ to determine phase error p; and
(4) adjusting the relationship between said I and Q signals to correct for said phase error p.

25. The process of claim 24, wherein:
said step of forming a phase angle error signal $\theta_E$ includes the substeps of:
(a) forming a first phase angle signal $\theta A$ based on said I' and Q' signals;
(b) forming a second phase angle signal $\theta_B$ based on said I and Q signals;
(c) forming a phase angle error signal $\theta_E$ based on said first and second phase angle signals $\theta_A$ and $\theta_B$; and
step of analyzing said phase angle error signal $\theta_E$ is also includes determining gain error g, and said step of adjusting the relationship between said I and Q signals includes correcting for said gain error g.

26. The process of claim 24, wherein:
said step of generating I' and Q' signals includes the substeps of:
(a) forming signals approximately representing 2IQ and $I^2-Q^2$,
(b) differencing said signals representing 2IQ and $I^2-Q^2$ with their DC components $DC_I$ and $DC_Q$.

27. The process of claim 26, wherein:
said step of generating I' and Q' signals further includes the substep of:
normalizing said signals representing 2IQ and $I^2-Q^2$ using a signal representing $I^2+Q^2$ as a common divisor; and
wherein
said step of differencing said signals representing 2IQ and $I^2-Q^2$ with their DC components is performed by differencing these signals with twice their DC components $2DC_I$ and $2DC_Q$.

28. The process of claim 24, wherein:
said step of adjusting said I and Q signals is performed in accordance with the equation:

$$Q_1 = bQ_\phi - aI$$

where:
$Q_1$ = Q signal as adjusted for errors
$Q_\phi$ = unadjusted Q signal
a = tan p
b = 1/(1+g)cosp
p = phase error
g = gain error.

* * * * *